US011914795B1

United States Patent
Krishnakumar et al.

(10) Patent No.: US 11,914,795 B1
(45) Date of Patent: Feb. 27, 2024

(54) INFORMATION HANDLING SYSTEM OPTICAL SWITCH KEYBOARD POWER MANAGEMENT

(71) Applicant: Dell Products L.P., Round Rock, TX (US)

(72) Inventors: Karthikeyan Krishnakumar, Austin, TX (US); Peng Lip Goh, Singapore (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/172,465

(22) Filed: Feb. 22, 2023

(51) Int. Cl.
  *G06F 3/023* (2006.01)
  *G06F 3/02* (2006.01)
(52) U.S. Cl.
  CPC .................................. *G06F 3/0202* (2013.01)
(58) Field of Classification Search
  None
  See application file for complete search history.

(56) References Cited

U.S. PATENT DOCUMENTS

| | | | |
|---|---|---|---|
| 9,098,142 B2 | 8/2015 | Westerman et al. | |
| 9,552,100 B2 | 1/2017 | Westerman et al. | |
| 10,083,805 B2 | 9/2018 | Knopf et al. | |
| 10,819,920 B1 | 10/2020 | Hamlin et al. | |
| 11,150,741 B1 * | 10/2021 | Stoeckli | G06F 3/0202 |
| 2008/0109190 A1 * | 5/2008 | Bauer | B60R 21/0134 |
| | | | 702/189 |

* cited by examiner

*Primary Examiner* — Carl Adams
(74) *Attorney, Agent, or Firm* — ZAGORIN CAVE LLP; Robert W. Holland

(57) ABSTRACT

An information handling system keyboard, or other type of input device, detects end user input presses with plural optical switches coupled to an aluminum plate. A magnetic field proximity sensor interfaced with the aluminum plate radiates a magnetic field through the aluminum plate to detect end user proximity based upon disruptions to the magnetic field. The optical switches power down their emitters when user absence is sensed and power up the emitters when the user presence is sensed. In alternative embodiments, the aluminum plate mounting of optical switches as described above may detect press inputs at mouse buttons or joystick triggers.

20 Claims, 5 Drawing Sheets

INFORMATION HANDLING SYSTEM OPTICAL SWITCH KEYBOARD POWER MANAGEMENT

BACKGROUND OF THE INVENTION

Field of the Invention

The present invention relates in general to the field of information handling system input devices, and more particularly to an information handling system optical switch keyboard power management.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information with processing components that execute instructions, such as a central processing unit (CPU) that executes instructions to process information and a random access memory (RAM) that stores the instructions and information. End users input information to an information handling system through input devices, such as a keyboard and mouse. Desktop and other types of stationary information handling systems generally use peripheral input devices, while portable information handling systems built in portable housings can use peripheral devices and also typically integrate input devices in the portable housing, such as keyboard and touchpad. Inputs and the results of processing are typically output at displays as visual images. The inputs and outputs vary based upon the type of applications executed on the CPU. An operating system manages end user interactions generally. Word processing and other types of office applications generally support office-type of functions. Gaming applications typically run at high processing speeds and output gaming results in high resolution visual images. Gaming applications tend to place heavy demands on information handling systems and input devices, such as keyboards and gaming peripherals like joysticks and triggers.

Conventional keyboards use a membrane with a switch matrix to detect key press values and a rubber dome under each key to bias the key away from the membrane. These rubber dome keyboards tend to have reliable and robust lifespans, however the keys are full height and the input response can seem a bit laborious. In situations that call for high numbers of rapid inputs, such as when executing gaming applications, keyboards with other types of sensors are sometimes selected to obtain more rapid input responses. As one example, optical switch keyboards deploy an optical switch at each key to detect depression of the key. A typical optical switch transmits an infrared or other spectrum light energy at a light receptor sensor that is blocked by an extension from the switch. When the key is biased to a raised position, the light receptor sensor does not detect the light energy, which is blocked by the extension proceeding from the key. When the key is pressed down so that the extension unblocks the light energy, the light receptor sensor detects the light energy and records an input. Optical switch keyboard keys offer a rapid response time. Other input devices that detect end user presses can use optical switches in a similar manner, such as joysticks, mouse input buttons and game controller triggers.

A disadvantage of optical switch input devices is that power draw in idle states can be high. For instance, the light energy generally has to emit towards the sensor in order for any input to be detected. The senor will not detect an input unless the light is emitted at the light sensor when the extension is removed from blocking the light emitter path to the light sensor. Constantly transmitting light is a draw on power that is approximately 02.mA for each transmitter. A keyboard can have 104 optical switches that result in a draw of 20.8 mA of power. If the keyboard enters a sleep mode that shuts off the light emitters, key inputs will not be detected that can wake the keyboard. In contrast, a conventional membrane keyboard has very little power draw until a key press closes a membrane switch to send an input signal. Thus, optical switch keyboards tend to have greater power draw, shorter battery life and poor power management.

SUMMARY OF THE INVENTION

Therefore, a need has arisen for a system and method which improves power management at an input device having optical switches.

In accordance with the present invention, a system and method are provided which substantially reduce the disadvantages and problems associated with previous methods and systems for managing power at an input device having optical switches. Information handling systems interface with input devices that detect inputs with optical switches having emitters enabled and disabled based upon magnetic field disruptions sensed through a mounting plate of the optical switches.

More specifically, an information handling system processes information with a processor and memory disposed in a housing and interfaced with one or more input devices that accept end user inputs, such as a keyboard, mouse and/or joystick. The input device detects press inputs with one or more optical switches coupled to a mounting plate, such as an aluminum plate. The optical switches emit light towards a sensor so that the position of the input device is determined by whether the emitted light reaches or is blocked from reaching the sensor. A magnetic field proximity sensor radiates a magnetic field through the mounting plate to detect end user absence or presence based upon disruptions detected in the magnetic field. When an end user is present, the light emitters transmit to support input detection by the light sensors. When an end user is absent, the light emitters and light sensors power down to reduce power consumption and then awaken when user presence is detected.

The present invention provides a number of important technical advantages. One example of an important technical advantage is that a keyboard having optical switches detects key inputs when an end user is present and powers down the optical switches when an end user is absent, thereby reducing power consumption and enhancing battery life. A typical keyboard with 104 keys having an optical switch at each key uses 0.2 mA per optical switch for a total of 20.8 mA of power consumption. Sleeping the power consumption when a user is absent reduces the power without impacting the end user experience. Radiating the magnetic field through the mounting plate that holds the optical switches supports a wide area of coverage and relates the end user presence detection to the keyboard typing positions.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Information handling systems interface with input devices that detect inputs with optical switches having emitters enabled and disabled based upon magnetic field disruptions sensed through a mounting plate of the optical switches. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
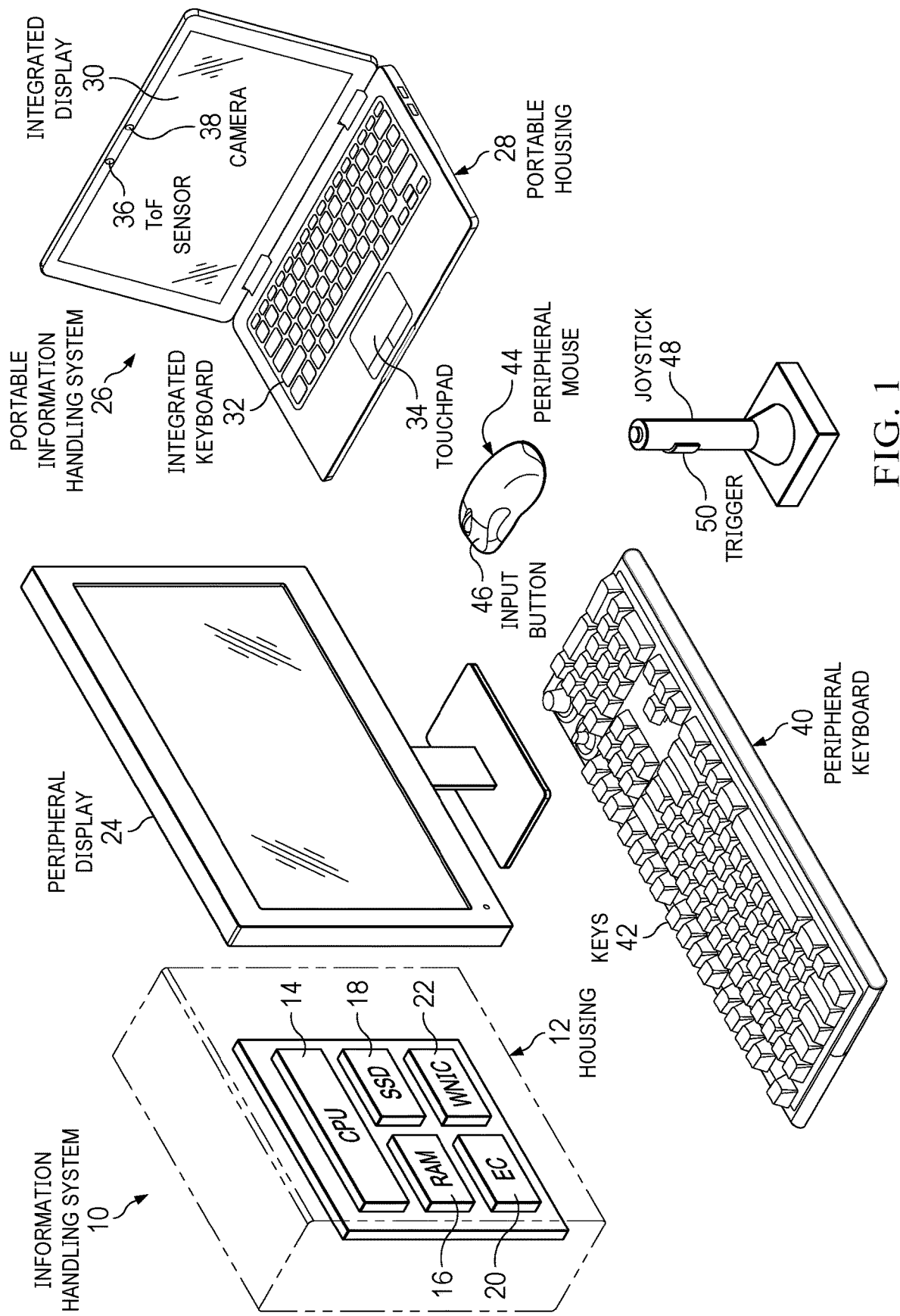
FIG. 1 depicts information handling systems interfaced with input devices that detect inputs with optical switches having emitters enabled and disabled based upon magnetic field disruptions sensed through a mounting plate of the optical switches.

Referring now to FIG. 1, information handling systems interface with input devices that detect inputs with optical switches having emitters enabled and disabled based upon magnetic field disruptions sensed through a mounting plate of the optical switches. The example embodiment depicts a stationary desktop information handling system 10 and a portable information handling system 26 that each interface with a peripheral display 24, peripheral keyboard 40, peripheral mouse 44 and peripheral joystick 48. Information handling system 10 has a stationary housing 12 that contains processing components that cooperate to process information. A central processing unit (CPU) 14 executes instructions to process information in cooperation with a random access memory (RAM) 16 that stores the instructions and information. A solid state drive (SSD) 18 provides persistent storage of instructions and information, such as an operating system and applications that execute on CPU 14. An embedded controller 20 manages physical operations of the system, such as application of power, maintenance of thermal conditions and interactions with peripheral devices. A wireless network interface controller (WNIC) 22 provides network communication with external networks and devices, such as through WiFi and BLUETOOTH. Portable information handling system 26 includes similar processing components in a portable housing 28 that supports mobile use with integrated input/output (I/O) devices, such as an integrated display 30, integrated keyboard 32 and integrated touchpad 34.

Peripheral keyboard 40 has plural keys 42 that accept end user presses as key input values and communicate the input values to embedded controller 20 for use by CPU 14. Peripheral mouse 44 includes an optical sensor that detects changes in position and reports the changes in position to embedded controller 20 to move a cursor presented on peripheral display 24. Peripheral mouse 44 has two or more input buttons 46 that detect end user presses to report to embedded controller 20. Peripheral joystick 48 provides a game controller with one or more triggers 50 that accept presses as inputs to a weapon or similar gaming function. Each of the peripheral devices include one or more optical switches that detect the input press by selectively blocking and passing light from an illumination source directed as a light sensor. Optical switches provide precise and rapid input detection with each optical switch having a minor yet continual power consumption related to light illumination. To reduce the power consumption, the peripheral input devices include a magnetic field proximity sensor that detect a proximity of an end user as absent or present and applies the absent or present state to power on and off the optical switches. In one example embodiment, the input device magnetic field proximity sensor may also take into account end user presence sensing when available from an information handling system, such as by a time of flight sensor 36 or camera 38. Advantageously, the magnetic field proximity sensor detects changes in magnetic fields related to hand positions at the peripheral input device so that optical switch operation and power consumption is controlled based on hand positions, not just user presence and absence. In another example embodiment, an integrated keyboard 32 in portable housing 28 may include optical switches. The availability of additional user presence information, such as from a time of flight sensor, may be applied to adjust timeouts described below or other factors for power optical switches on and off.

Figure 2:
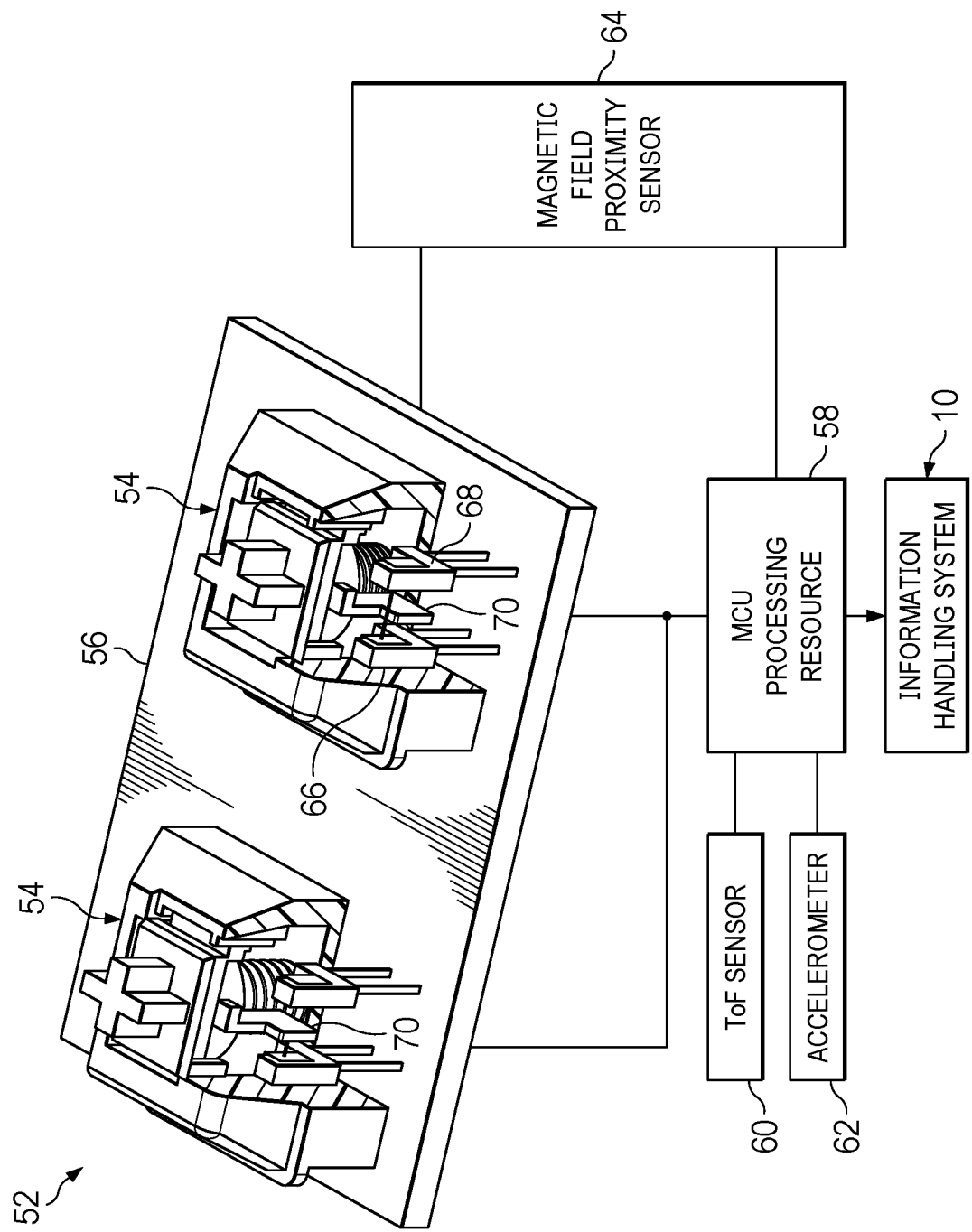
FIG. 2 depicts an example of an input device that detects inputs with optical switches having emitters enabled and disabled based upon disruptions sensed at a plate that mounts the optical switches.

Referring now to FIG. 2, an example depicts an input device 52 that detects inputs with optical switches having emitters 66 enabled and disabled based upon disruptions sensed at a plate 56 that mounts the optical switches. Input device 52 may include a variety of peripheral or integrated devices that accept press inputs, such as a keyboard having keys, a mouse having buttons and a joystick having triggers. Each optical switch 54 has a plunger with a member 70 that depresses to move relative to an optical path between an light emitter 66, such as an infrared emitter, and a light sensor 68. When the plunger and member 70 are in a raised position, light sensor 68 is blocked from light emitter 66 so that the lack of sensed light indicates no input press. When the plunger and member 70 are depressed, light from light emitter 66 passes to light sensor 68 to indicate an input. An MCU processing resource 58 receives the input indication for communication to an information handling system 10. In the example embodiment, the optical switches couple to an aluminum plate 56 to hold in position, such as an array of keyboard keys or under a set of mouse buttons or joystick triggers. In alternative embodiments, other types of conductive materials are used to support the optical switches in position. The aluminum plate 56 interfaces with a magnetic field proximity sensor 64, which uses the conductivity to radiate a magnetic field that is disrupted when an end user hand approaches the optical switches. When magnetic field proximity sensor 64 detects a disruption in the magnetic field, it issues a GPIO signal to MCU processing resource 58 to enable the optical switch emitters and sensors. When no user presence is detected for a predetermined time, magnetic field proximity sensor 64 provides no feedback so that MCU processing resource 58 powers down the optical switches to reduce power consumption by the light emitters and light sensors. The amount of time for power up and power down of optical switches 54 and the sensitivity of magnetic field proximity sensor 64 may adjust based on user presence detected by other sensors, such as time of flight sensor 60 and an accelerometer 62.

In one example embodiment, magnetic field proximity sensor 64 is an Azoteq IQS7223 integrated circuit chip that uses aluminum plate 56 as a top transmitter electrode to detect magnetic field disruption through mutual capacitance. A pulse current drives from one end of aluminum plate 56 to an opposite end where it is communicated back to the sensor by a wire or cable that acts as a bottom receive electrode for detection of mutual capacitance. In the example of a keyboard having multiple rows of plural keys, the support plate provides a wide area corresponding to the size of the keyboard so that a relatively sensitive sensor can detect hand proximity with relative evenness at all locations where an end user hand may be placed to make a key input. In one embodiment, magnetic field proximity sensor 64 may power off when the optical switches are powered on so that power consumption is reduced and then power back up when the optical switches power down, such as after a timeout during which no inputs are detected. In another embodiment, the magnetic field proximity sensor powers up to check for user presence before the optical switches power down so that, when a user hand is present without making inputs, the optical switches will remain on to detect inputs until user absence is detected.

Figure 3:
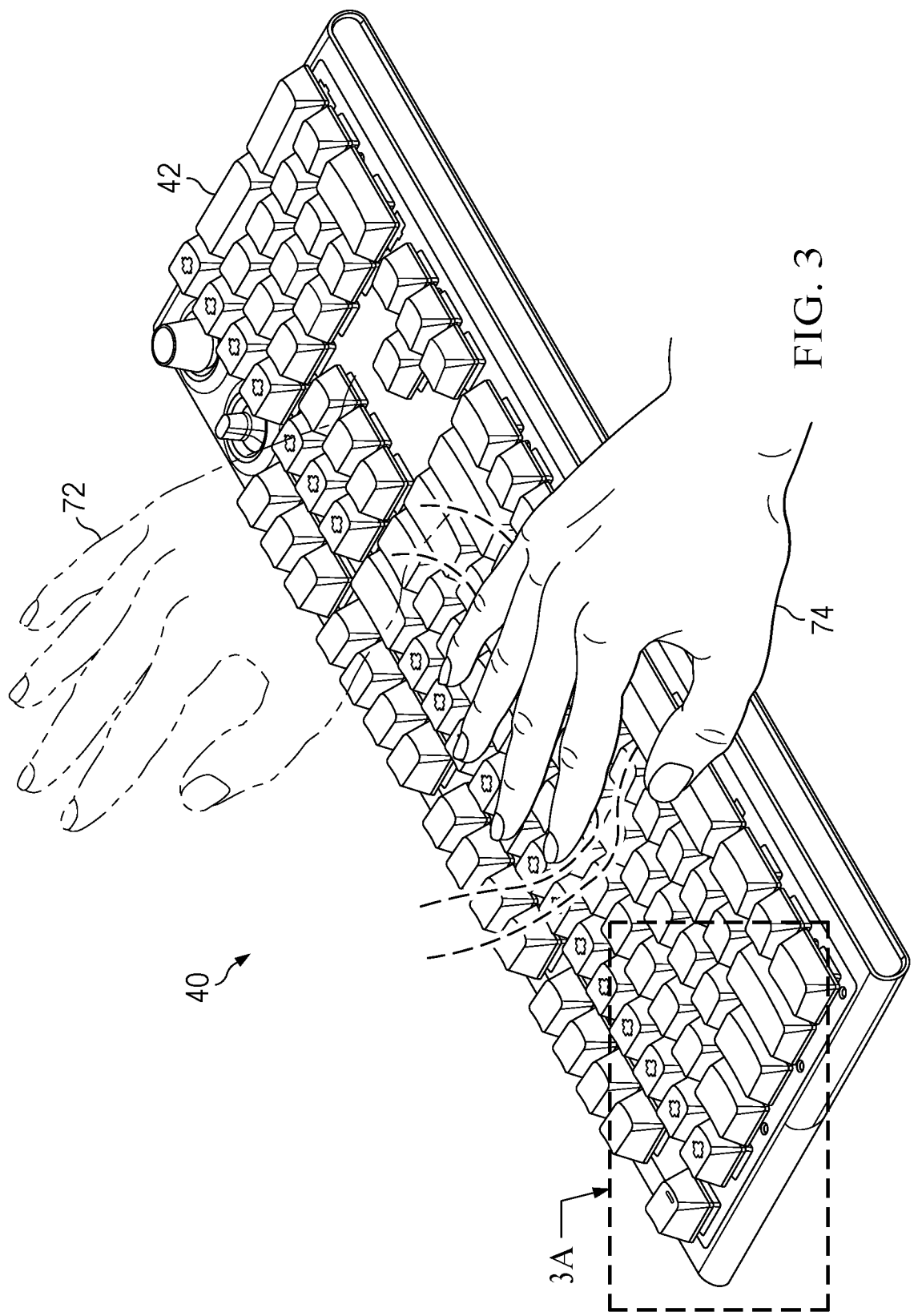
FIGS. 3 and 3A depict a keyboard having optical switches to detect key inputs and a magnetic field proximity sensor to enable and disable emitters of the optical switches based upon user presence detected as disruptions in a magnetic field.
Figure 3A:
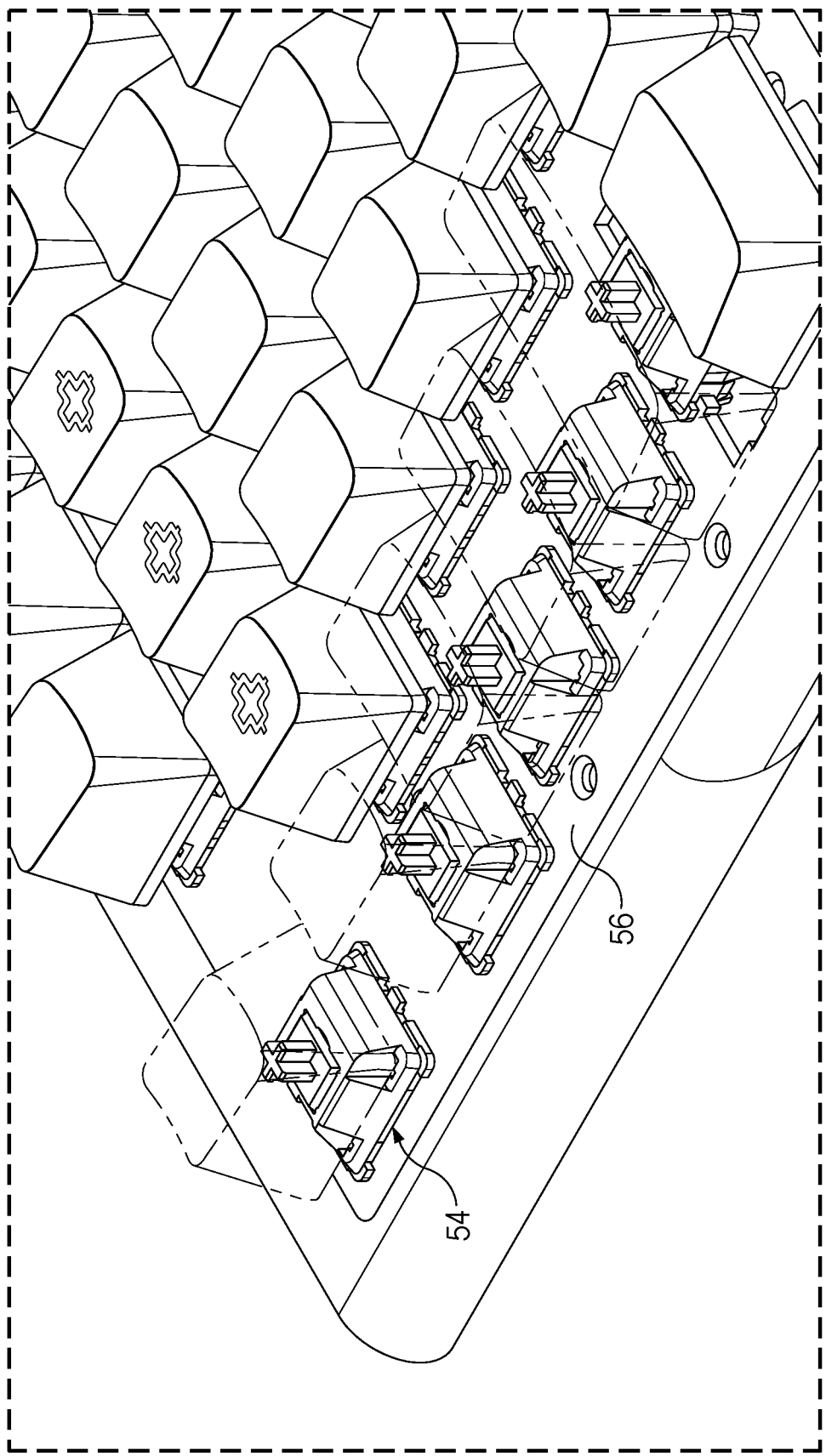

Referring now to FIGS. 3 and 3A, a keyboard 40 is depicted that has optical switches to detect key 42 inputs and a magnetic field proximity sensor to enable and disable emitters of the optical switches based upon user presence detected as disruptions in a magnetic field. An end user hand 72 that moves over keyboard 40 creates disruptions 74 in the magnetic field radiated over keyboard 40 by the pulse current through aluminum plate 56 disposed as a support under the optical switches 54 located at each key 42. The disruptions in the magnetic field indicates an end user presence to command power to the optical switches. A lack of magnetic field disruptions indicates an end user absence so that the optical switches may power down.

Figure 4:
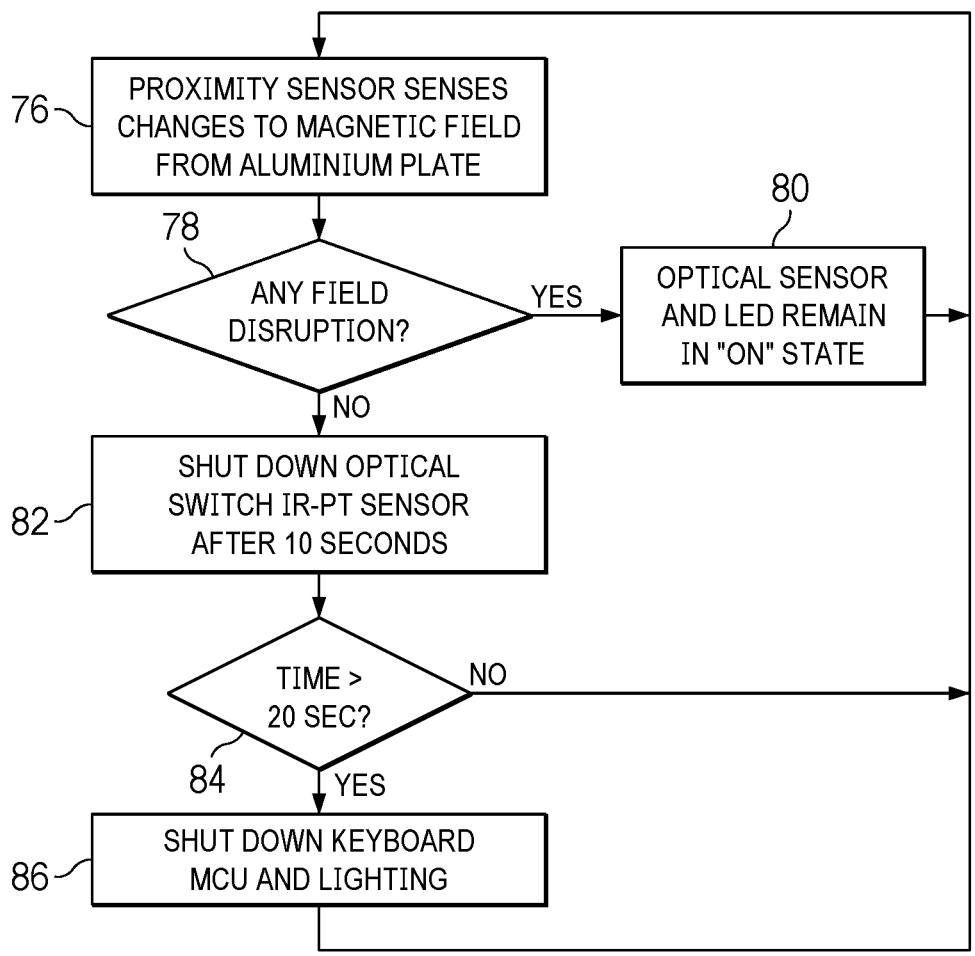
FIG. 4 depicts a flow diagram of a process for managing power at a keyboard based upon user presence and absence detected by disruptions in a magnetic field radiated through an aluminum mounting plate.

Referring now to FIG. 4, a flow diagram depicts a process for managing power at a keyboard based upon user presence and absence detected by disruptions in a magnetic field radiated through an aluminum mounting plate. The process starts at step 76 with the proximity sensor sensing changes to the magnetic field radiated over the keyboard by the aluminum plate that supports the keyboard keys and optical switches. At step 78 a determination is made of whether a magnetic field disruption is detected. The sensitivity of the magnetic field disruption detection may vary based upon other indications of end user presence, as described above. If at step 78 a magnetic field disruption is detected, the process continues to step 80 to continue with power applied to the light emitters and light sensors of the optical switches and the process returns to step 76 to continue monitoring for end user presence. If at step 78 a magnetic field disruption is not detected, the process continues to step 82 to shut down the infrared light emitters and sensors of the optical switches after a ten second timeout without any magnetic field disruptions. As described above, the timeout to power down may vary based upon other indications of end user presence. Once a power down of the optical switches is commanded, the process continues to step 84 to determine if a twenty second timeout has passed associated with sleeping of the keyboard MCU processing resource. If the twenty second timeout without magnetic field disruptions has not passed, the process returns to step 76 to continue monitoring for user presence. Once the twenty second timeout has passed at step 84, the process continues to step 86 to shutdown the keyboard MCU processing resource and lighting. Once the keyboard processor sleeps, the proximity sensor continues monitoring for user presence and sends a GPIO to wake the MCU processing resource when an end user presence is detected. Upon waking, the MCU processing resource determines a user presence and powers up the optical switches to accept typed key inputs at the keyboard.

Although the present invention has been described in detail, it should be understood that various changes, substitutions and alterations can be made hereto without departing from the spirit and scope of the invention as defined by the appended claims.

What is claimed is:

1. An information handling system comprising:
a housing;
a processor disposed in the housing and operable to execute instructions that process information;
a memory disposed in the housing and interfaced with the processor to store the instructions and information; and
an input device interfaced with the processor and having one or more optical switches mounted on an aluminum plate to detect inputs, the input device further having a magnetic field proximity sensor, a processing resource and a non-transitory memory interfaced with the processing resource and storing instructions that when executed on the processing resource cause:
power off at the one or more optical switches in response to a predetermined condition; and power on at the one or more optical switches in response to detection by the magnetic field proximity sensor of disruption of a magnetic field radiated from the aluminum plate.

2. The information handling system of claim 1 wherein the instructions further:
selectively command the magnetic field proximity sensor to radiate the magnetic field through the aluminum plate when the one or more optical switches are disabled; and
selectively command the magnetic field proximity sensor off when the one or more optical switches are enabled.

3. The information handling system of claim 2 wherein the predetermined conditions comprise a predetermined idle time having no inputs detected by the one or more optical switches.

4. The information handling system of claim 2 wherein the predetermined conditions comprise a predetermined idle time having no disruptions of the magnetic field detected by the magnetic field proximity sensor.

5. The information handling system of claim 1 wherein the input device comprises a keyboard having plural keys and the one or more optical switches couple to the aluminum plate at each of the plural keys to detect a press of the key.

6. The information handling system of claim 5 wherein the keyboard is configured as a peripheral keyboard separate from the housing.

7. The information handling system of claim 5 wherein the keyboard is integrated in the housing.

8. The information handling system of claim 1 wherein the input device comprises a mouse having an input button and the one or more optical switches couple to the aluminum plate at the input button to detect presses of the input button.

9. The information handling system of claim 1 wherein the input device comprises a joystick having a trigger and the one or more optical switches couple to the aluminum plate at the trigger to detect presses of the trigger.

10. A method for managing an information handling system input device power use, the method comprising:
coupling plural optical switches to an aluminum plate, each optical switch configured to detect a press with a light emitter aligned with a light sensor;
interfacing a magnetic field proximity sensor with the aluminum plate;
sensing user presence and absence proximate the optical switches based upon disruptions to a magnetic field radiated through the aluminum plate;
enabling the light emitters when user presence is sensed; and
disabling the light emitters when user absence is sensed.

11. The method of claim 10 further comprising:
selectively radiating the magnetic field with the magnetic field proximity sensor when the light emitters are disabled; and
selectively disabling the radiating the magnetic field when the light emitters are enabled.

12. The method of claim 10 wherein:
the input device comprises a keyboard having plural keys; and
depression of each key is detected by one or more of the optical sensors.

13. The method of claim 12 wherein the keyboard is configured as a peripheral device to operate separate from an information handling system housing.

14. The method of claim 12 wherein the keyboard is configured to integrate into a portable information handling system housing.

15. The method of claim 10 wherein the input device comprises a mouse having an input button and the one or more optical switches couple to the aluminum plate at the input button to detect presses of the input button.

16. The method of claim 10 wherein the input device comprises a joystick having a trigger and the one or more optical switches couple to the aluminum plate at the trigger to detect presses of the trigger.

17. An input device comprising:
an aluminum plate;
plural optical switches mounted on the aluminum plate and configured to detect press inputs;
a magnetic field proximity sensor interfaced with the aluminum plate;
a processing resource; and
a non-transitory memory interfaced with the processing resource and storing instructions that when executed on the processing resource cause:
disabling the plural optical switches in response to a predetermined condition; and
enabling the plural optical switches in response to detection by the magnetic field proximity sensor of disruption of a magnetic field radiated at the aluminum plate.

18. The input device of claim 17 wherein the instructions further:
selectively command the magnetic field proximity sensor to radiate the magnetic field through the aluminum plate when the one or more optical switches are disabled; and
issuing a GPIO from the magnetic field proximity sensor to wake the processing resource when the disruption of the magnetic field is detected.

19. The input device of claim 18 wherein the input device comprises a keyboard having plural keys and each of the plural optical switches aligns with one of the plural keys to detect presses of the keys.

20. The input device of claim 19 wherein the keyboard is configured as a peripheral keyboard separate from an information handling system housing.

* * * * *